United States Patent [19]

Fry

[11] 4,270,156

[45] May 26, 1981

[54] ELECTRONIC SYNCHRONIZATION MONITOR

[75] Inventor: Warren C. Fry, Connellsville, Pa.

[73] Assignee: General Equipment & Mfg. Co., Inc., Louisville, Ky.

[21] Appl. No.: 28,559

[22] Filed: Apr. 9, 1979

[51] Int. Cl.³ .............................................. H02H 3/36
[52] U.S. Cl. ....................................... 361/21; 361/85; 361/92; 307/87
[58] Field of Search ....................... 361/21, 20, 85, 86, 361/185, 187, 110, 111, 92; 307/87, 84, 85, 86, 64, 65, 43, 73, 75

[56] References Cited

U.S. PATENT DOCUMENTS 3,562,545  2/1971  Rubner et al. .......................... 307/87
3,588,519  6/1971  Luebrecht .............................. 307/87

Primary Examiner—Patrick R. Salce
Attorney, Agent, or Firm—Maynard C. Yeasting

[57]. ABSTRACT

An electronic sensing circuit monitoring the voltage on each of two alternating current power lines indicates when a load may be transferred from one of the power lines to the other without generating undesirable transient voltages or currents in the load.

3 Claims, 1 Drawing Figure

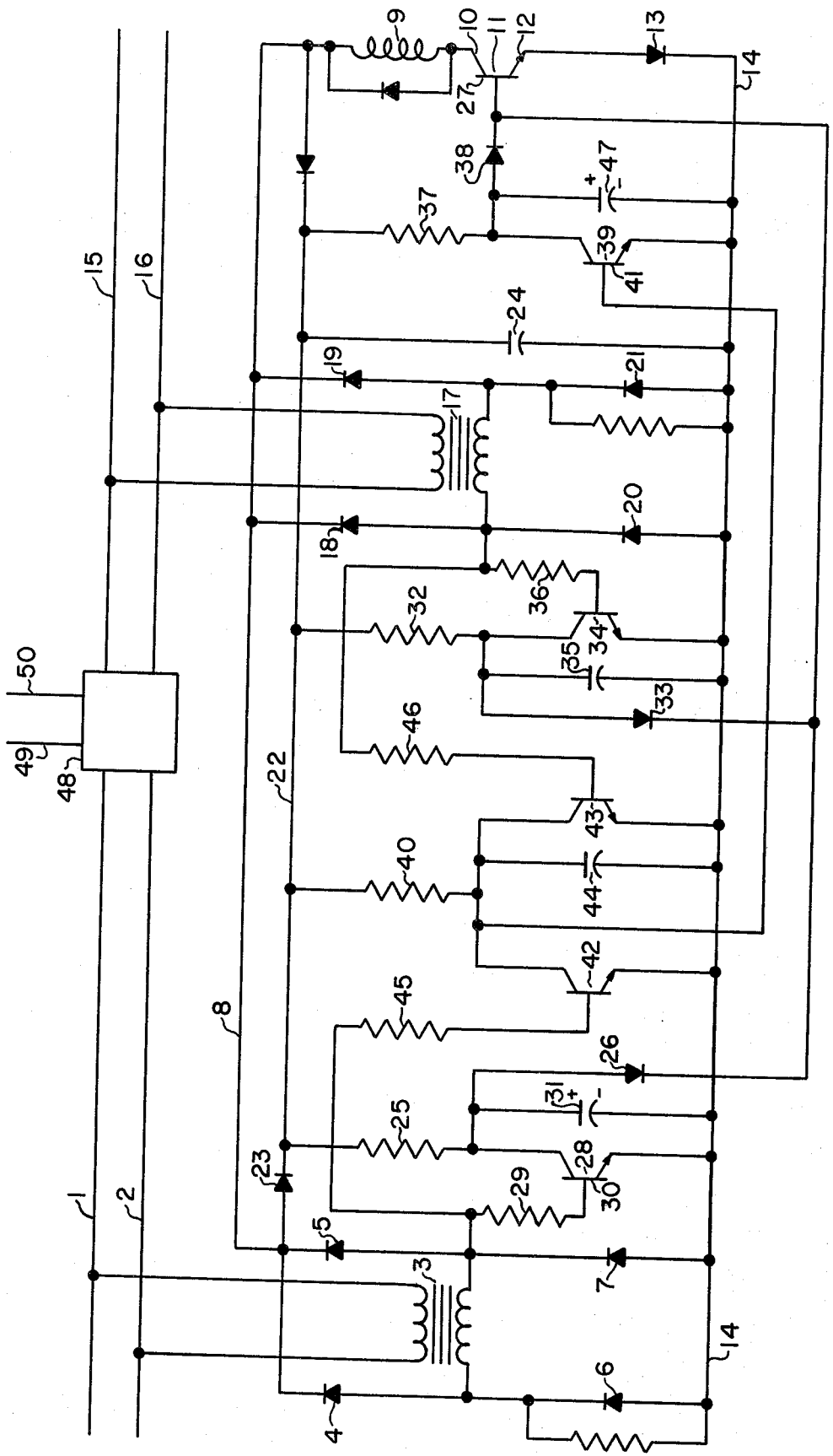

ELECTRONIC SYNCHRONIZATION MONITOR

BRIEF SUMMARY OF THE INVENTION

When the continuity of electrical power to a facility, such as a hospital, is of vital importance it is common practice to provide at the facility a stand-by electrical generator driven by a gasoline or diesel engine to energize a local power line. The generator is started and the load switched to the generator power line whenever at outage or abnormally low voltage occurs on the commercial power line serving the facility. This invention relates to monitoring equipment that responds to voltage or lack of voltage on the power line and the standby generator output line to indicate when a load may be transferred from the generator line to the power line or vice versa without causing voltage or current surges in the load. If either of the power lines is "dead" the load can be transferred without any danger. Further, if the voltages are synchronized a transfer may be made. Therefore the circuit is arranged to indicate or permit a transfer as long as either or both power lines are "dead" or if the voltages on the lines are synchronized in phase and frequency. Under these conditions the transients can be no worse than those produced when the load is connected to a power line.

In a preferred form of the invention an output indicator or relay is energized if only one line is energized or if both lines are energized and are synchronized in frequency and phase. The circuit includes a condenser for each line that is charged from a D.C. power supply energized from either power line and that is discharged by an electronic switch during alternate half cycles of the voltage on the associated power line. The output indicator responds to the voltage on the condenser. A third condenser is charged from the D.C. supply and discharged by either of two electronic switches, one for each power line, during alternate half cycles of the voltage on the lines. If the lines are synchronized the switches alternate to keep the condenser discharged. If the lines are not synchronized a time interval proportional to the lack of synchronization occurs each cycle during which time interval the condenser is allowed to charge. If the condenser voltage reaches a certain voltage level the output indicator or relay is deenergized to indicate an out-of-phase condition.

A schematic diagram of a circuit according to the invention is illustrated in the accompanying drawing.

BRIEF DESCRIPTION OF THE DRAWING

In the drawing the single FIGURE is a schematic diagram of a preferred form of the invention.

DESCRIPTION OF A PREFERRED EMBODIMENT

Referring to the drawing, a first alternating current power line 1,2 is connected through a transformer 3 to a full wave bridge rectifier comprising diodes 4,5,6, and 7. Diodes 4 and 5 have their cathodes connected to lead 8. A relay coil 9 is connected between lead 8 and a collector 10 of a transistor 11. An emitter 12 of the transistor 11 is connected through a light emitting diode 13 to a D.C. return lead 14 connected to anodes of the rectifier diodes 6,7.

A second alternating current power line 15,16 supplied from a standby generator, not shown, is connected through a transformer 17 to a second full wave rectifier comprising diodes 18, 19, 20, and 21. Diodes 18, and 19 are connected to the lead 8 while diodes 20, 21 are connected to the return line 14. Thus, either alternating current power line when energized supplies full wave rectified voltage to leads 8 and 14.

A filtered D.C. supply voltage lead 22 is energized from lead 8 through a diode 23 and is connected to return lead 14 through a condenser 24.

The transistor 11, controlling the relay 9, is turned on by any of three circuits. A first circuit comprising a resistor 25 and diode 26 connected between the supply lead 22 and a base 27 of the transistor 11 provides base current if the standby generator is operating to supply power to lead 22 and if the first power line is dead so that a first electronic switch comprising transistor 28 cannot bypass current from resistor 25 to the return lead 14. If there is voltage on the first power line 1, 2 there is voltage across the secondary of transformer 3 and current flows, on alternate half cycles, through a resistor 29 and base 30 of transistor 28. This transistor, acting as an electronic switch, returns the current through resistor 25 to the return lead 14. A condenser 31 of sufficient size limits the rise in voltage during the alternate half cycles to less than that required to turn on the relay transistor 11.

In like manner, a second circuit comprising a resistor 32, diode 33, transistor 34, condenser 35 and base resistor 36 turns the relay transistor 11 on if there is voltage on lines 1 and 2 and none on lines 15, 16.

A third circuit controls the relay transistor to energize the relay 9 when the voltages on the two power lines differ in frequency and phase by less than prescribed amounts. This third circuit includes a resistor 37 and diode 38 connected between the supply lead 22 and the base 27 of the relay transistor 11. A control transistor 39 is connected between the resistor 37 and the return lead 14. The relay transistor 11 is conductive as long as current flows through resistor 37, diode 38 to the base 27 of the transistor, i.e. the control transistor 39 is "off". Base current for the control transistor 39 is obtained through a resistor 40 connected between the supply lead 22 and a base 41 of the control transistor 39.

The base 41 is also connected to the return lead 14 by a pair of electronic switches comprising transistors 42, 43 and a condenser 44. Bases of the transistors 42, 43 are connected through resistors 45, 46 to the secondaries of the transformers 3 and 17. In this arrangement, when the voltages on the two A.C. lines are in phase, the electronic switch transistors 42 and 43 alternate in diverting current away from the control transistor 39, thus allowing the relay to operate. If the line voltages are out of phase the conductive periods overlap during parts of each cycle leaving a portion of each cycle when neither transistor is conductive. During these periods the condenser 44 charges and, if the time is long enough, current flows through the control transistor to discharge condenser 47 and turn the relay transistor 11 "off".

The condenser 44 and resistor 40 are selected so that no current flows in the control transistor 39 as long as the phase difference between the A.C. line voltages is less than about 15°. The condenser 47 is selected so that the control transistor 39 must be off for a selected time interval before the relay transistor 11 may operate. This time interval is made long enough to prevent operation of the relay if the A.C. frequency on one line differs substantially from the A.C. frequency on the other line.

Under this condition the line voltages are in phase for brief intervals.

A transfer switch 48 is arranged to connect load lines 49, 50 to the A.C. lines 1,2 for normal operation or to the standby lines 15, 16. This switch must be constructed so that under no circumstances may the lines 1 and 2 be connected to the lines 15, 16. Such a connection would be hazardous for any repair crews working on the system feeding the A.C. lines 1 and 2 and would overload the standby generator feeding the lines 15, 16.

The transfer switch 48 may, for example, be a latch relay with triple pole, double throw contacts for three phase power lines or double pole, double throw for single phase lines. In either case push buttons and contacts of the relay 9 are used in the operate coils of the relay to inhibit operation of transfer switch in the event both lines are energized but are not synchronized in phase or frequency.

What is claimed is:

1. An electronic power line synchronization monitor comprising, in combination, a first rectifier connected to a first of two power lines being monitored, a second rectifier connected to a second of two power lines being monitored, a first electronic switch that is conductive during alternate half cycles of the voltage on the first power line, a second electronic switch that is conductive during alternate half cycles of the voltage on the second power line, a condenser that is connected through a resistor to said rectifiers, said electronic switches being connected to and arranged to discharge said condenser when conductive, and indicating means powered by said rectifiers and connected to said condenser for indicating a rise in voltage on said condenser.

2. A synchronization monitor according to claim 1 in which the indicating means comprises a relay.

3. In a synchronization monitor according to claim 1, a third electronic switch arranged to be conductive during alternate half cycles of the voltage on the first power line, a fourth electronic switch arranged to be conductive during alternate half cycles of the voltage on the second power line, a condenser in parallel with each of the third and fourth electronic switches, means for charging the condensers, said switches being arranged to discharge the associated condenser when conductive, and means connected to said condensers for energizing said indicating means.

* * * * *